(12) United States Patent
McNeely et al.

(10) Patent No.: US 6,615,856 B2
(45) Date of Patent: Sep. 9, 2003

(54) REMOTE VALVING FOR MICROFLUIDIC FLOW CONTROL

(75) Inventors: Michael R. McNeely, Sandy, UT (US); Mark K. Spute, Salt Lake City, UT (US)

(73) Assignee: BioMicro Systems, Inc., Salt Lake City, UT (US)

( * ) Notice: Subject to any disclaimer, the term of this patent is extended or adjusted under 35 U.S.C. 154(b) by 0 days.

(21) Appl. No.: 09/922,451

(22) Filed: Aug. 3, 2001

(65) Prior Publication Data

US 2002/0033193 A1 Mar. 21, 2002

Related U.S. Application Data

(60) Provisional application No. 60/223,022, filed on Aug. 4, 2000.

(51) Int. Cl.[7] ............................................. F15C 1/04
(52) U.S. Cl. ......................... 137/14; 137/805; 137/806; 137/833
(58) Field of Search ...................... 137/805, 806, 137/833, 14

(56) References Cited

U.S. PATENT DOCUMENTS

| | | | | |
|---|---|---|---|---|
| 4,426,451 A | * | 1/1984 | Columbus | 436/518 |
| 4,676,274 A | * | 6/1987 | Brown | 137/806 |
| 5,375,979 A | | 12/1994 | Trah | 417/52 |
| 5,730,187 A | * | 3/1998 | Howitz et al. | 137/803 |
| 5,789,045 A | * | 8/1998 | Wapner et al. | 137/802 |
| 5,856,174 A | | 1/1999 | Lipshutz et al. | 435/286.5 |
| 5,863,801 A | | 1/1999 | Southgate et al. | 436/63 |
| 5,865,308 A | * | 2/1999 | Qin et al. | 206/219 |
| 5,866,345 A | * | 2/1999 | Wilding et al. | 435/7.21 |
| 5,897,842 A | | 4/1999 | Dunn et al. | 422/131 |
| 5,922,591 A | | 7/1999 | Anderson et al. | 435/287.2 |
| 6,036,923 A | | 3/2000 | Laugharn, Jr. et al. | 422/82.13 |
| 6,043,080 A | | 3/2000 | Lipshutz et al. | 435/287.2 |
| 6,046,056 A | * | 4/2000 | Parce et al. | 422/82.01 |
| 6,068,752 A | * | 5/2000 | Dubrow et al. | 204/604 |
| 6,130,098 A | | 10/2000 | Handique et al. | 436/180 |
| 6,136,212 A | | 10/2000 | Mastrangelo et al. | 216/49 |
| 6,152,181 A | * | 11/2000 | Wapner et al. | 137/807 |
| 6,168,948 B1 | | 1/2001 | Anderson et al. | 435/287.2 |
| 6,197,595 B1 | | 3/2001 | Anderson et al. | 436/180 |
| 6,296,020 B1 | * | 10/2001 | McNeely et al. | 137/806 |

FOREIGN PATENT DOCUMENTS

| | | |
|---|---|---|
| WO | WO 97/22825 | 6/1997 |
| WO | WO 99/39120 | 8/1999 |
| WO | WO 00/53319 | 9/2000 |
| WO | WO 00/78454 | 12/2000 |
| WO | WO 01/09598 | 2/2001 |

OTHER PUBLICATIONS

Anderson, et al., "Microfluidic Biochemical Analysis System", Tranducers '97, pp. 477–480.

* cited by examiner

*Primary Examiner*—A. Michael Chambers
(74) *Attorney, Agent, or Firm*—Madson & Metcalf

(57) ABSTRACT

A method of controlling fluid flow within a microfluidic circuit using external valves and pumps connected to the circuit is disclosed. The external valves and pumps, which are not a part of the microfluidic substrate, control fluid pumping pressure and the displacement of air out of the fluid circuit as fluid enters into the circuit. If a valve is closed, air cannot be displaced out of circuit, which creates a pneumatic barrier that prevents fluid from advancing within the circuit (under normal operating pressures). Applications of this method of fluid control are explained.

54 Claims, 5 Drawing Sheets

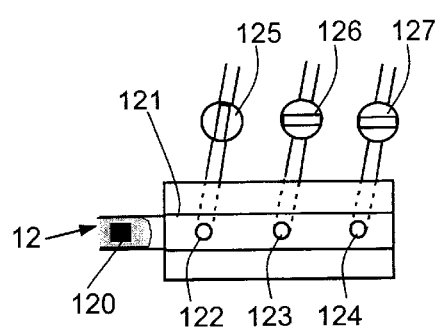 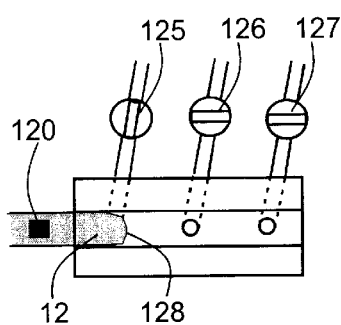 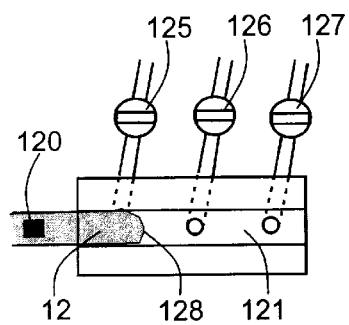
Fig. 7A   Fig. 7B   Fig. 7C
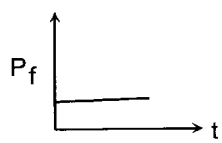 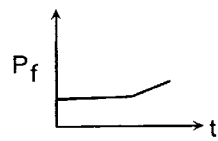 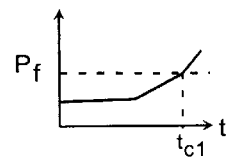
Fig. 7D   Fig. 7E   Fig. 7F

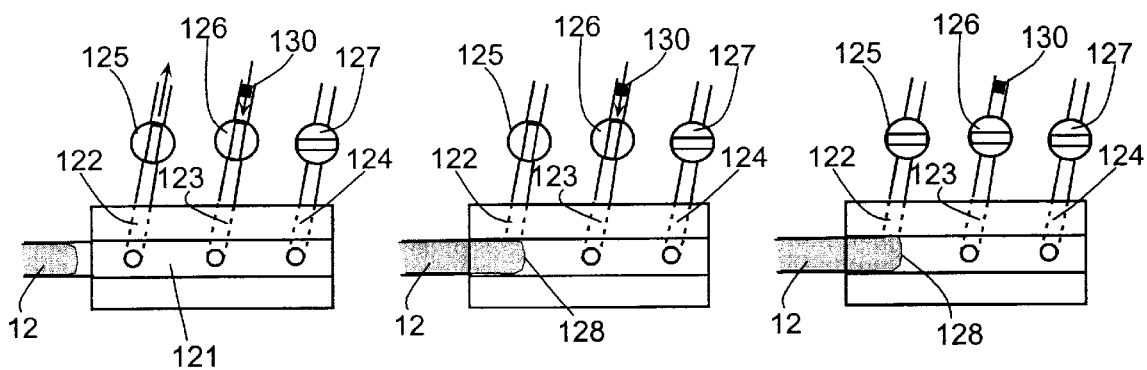
Fig. 8A          Fig. 8B          Fig. 8C
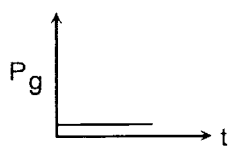 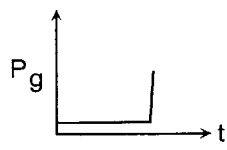 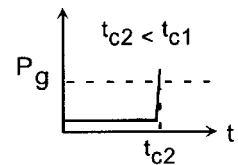
Fig. 8D          Fig. 8E          Fig. 8F

REMOTE VALVING FOR MICROFLUIDIC FLOW CONTROL

This application claims the benefit of Provisional Application No. 60/223,022 filed Aug. 4, 2000.

BACKGROUND OF THE INVENTION

1. The Field of the Invention

The present invention relates to the field of microfluidic circuitry for biochemical processes or reactions. It relates more specifically to the sensing and regulation of the pressure and movement of fluids through the microfluidic circuitry.

2. Background of the Invention

Microfluidics involves the manipulation of small volumes of fluid in structures. having microdimensions and formed in a substrate of silicon, plastic, glass, or the like. Microfluidic devices often contain multiple channels or wells and are used for chemical or biological processing and analysis of liquid samples. These channels and wells in microfluidic devices are known as microfluidic circuits. If a microfluidic circuit has any degree of complexity, a method is needed, either active or passive, for controlling the flow of fluid through the circuit.

Active methods of fluid control include the use of mechanical valves and the application of electrical or magnetic fields to influence the movement of fluid (or particles in the fluid) within the microfluidic circuit. However, incorporating mechanical valves into a microfluidic circuit can make it complex and expensive. Electromagnetic field methods may require complex interfacing and possibly high electrical voltages.

Passive methods of fluid control usually involve the manipulation of capillary forces to stop or drive fluid movement. Passive methods may not be possible if the fluid is or contains a large concentration of solvents, surfactants, lipids or aliphatic compounds, because they may reduce the surface tension of the fluid, which reduces the capillary forces.

It has been recognized that if passive methods cannot be used and the characteristics of field methods are not desirable, it would be beneficial if the complex valving mechanisms used for active fluid control, could be moved off of the substrate. In this manner the microfluidic circuit substrate could be made as inexpensively as possible by transferring the complex and expensive components into a permanent fixture, thus allowing the microfluidic substrate portion to be inexpensive and disposable.

One example of such a design is the use of pneumatic actuation performed with external pumps and valves. Another example is the use of external actuators for moving diaphragm membrane valves that are within the circuit. These two examples, however, still require complex structures within the substrate such as the hydrophobic air ducts or flexible membranes. These attempts at moving the complex mechanical structures off the substrate are therefore more complicated than may be desirous.

Another exemplary method for regulating the movement of fluids through a microfluidic circuit is to combine passive and active control methods to utilize an air vent (or air duct) in support of a capillary barrier in cooperation with a capillary stop junction. In this method, the fluid flows through a capillary channel and is primarily controlled by a capillary stop junction. The reliability of the capillary stop junction is increased by the addition of an air vent. The fluid is drawn through the microfluidic circuit by positive capillary forces, such as aqueous fluids being drawn by capillarity through a hydrophilic channel. When the air vent is closed, the air vent supports the capillary barrier at the capillary stop junction to control the advancement of fluid through the microfluidic circuit. Because the air vent supports a capillary barrier, this method of fluid control will not function independent of a capillary junction.

These attempts to effectively control the fluid flow within a microfluidic circuit rely primarily on expensive mechanical devices within the substrate or on capillary forces to provide flow barriers. It would be a significant improvement in the art to provide a microfluidic circuit that is capable of controlling fluid flow without the use of capillary forces. It would also be a significant advancement in the art to provide a substrate for a microfluidic circuit that does not incorporate any complex or expensive parts, thus allowing the substrate to be inexpensive and disposable.

BRIEF SUMMARY OF THE INVENTION

The present invention is directed towards a microfluidic circuit in which fluid flow through the circuit is regulated by external valves that control the displacement of air within the circuit. Air displacement ducts are connected to external valves. If the valves are open fluid advances into a circuit driven by positive hydrostatic pressure, such as that generated by an external syringe pump. If the valves are closed, the advancing fluid pushes against a closed air column, or a pneumatic pressure barrier, which, under normal operating parameters, stops the further advancement of the fluid. A pneumatic pressure barrier can be used not only to stop fluid advancement in a circuit, but also to divert fluid flow from a blocked channel into an adjacent, open channel. In this manner the fluid can be controlled as it advances through a possibly complex, highly multiplexed system. This control is performed by the use of external valves and pumps that do not need to be incorporated into the microfluidic substrate. Once fluid has reached an air escape duct it is prevented from entering the duct by the use of capillary barriers or other passive valves at the junction between the fluid channel and the air duct, or by blockage of the duct by a swellable material such as a hydrdogel. Entry of fluid into the duct can also be blocked by closing the external air duct valve at the appropriate time in the fluid manipulation or by placing a fixed volume air bladder at the outlet of the air duct, either of which serves to establish a closed air column against which the fluid cannot advance.

The microfluidic circuit is constructed in a substrate. The substrate has at least one channel for fluid flow and at least one air duct in communication with each channel. There is at least one stopping point in the circuit where the fluid is at least temporarily stopped. The fluid is stopped at these stopping points by a controllable pneumatic pressure barrier in the circuit. Conveniently, the air ducts in communication with the channel are configured to control the pneumatic pressure barrier, and there is an air duct in communication with each of the stopping points within the circuit.

The pneumatic pressure barrier that controls the advancement of the fluid through the circuit is formed by the fluid entering the circuit and compressing the air within the channel and the air ducts. Because there is no outlet for the compressed air, it prevents the advancement of the fluid. The fluid is subsequently allowed to advance by opening a downstream air duct that allows the compressed air to escape. The downstream air duct may be opened to the atmosphere or it may be opened to a fixed volume expansion bladder. Preferably, the air ducts are configured to close when the fluid reaches the stopping point with which each air duct is associated, such that the fluid is stopped in its progress through the circuit and is also prevented from advancing too far into the air duct.

To facilitate the proper opening and closing of the air ducts, the microfluidic circuit may further comprise a sensor that determines the location of the fluid within the circuit and signals for the closure of air ducts such that the fluid flow is at least temporarily stopped at a stopping point. The sensor may be an optical sensor, and it may be located in a top plate that overlies the fluid channels. Alternatively, the sensor may be a fluid pressure sensor located at the fluid inlet to measure the backpressure on the fluid or an air pressure or flow sensor located on an air duct to measure the pressure or flow within the air duct.

The present invention is also directed towards a method of controlling fluid flow within a microfluidic circuit utilizing the microfluidic circuit described and pneumatic pressure barriers. The movement of fluid together with the opening and closing of air ducts, as well as injection of air, are used to generate pneumatic pressure barriers. For example, it is difficult or impossible to introduce fluid into a tube that is only open on one end. Similarly, it is also difficult to introduce fluid into a tube with one end open and one end connected to a valve that is closed. If the valve were opened, air could escape at the same time as fluid enters the tube. Hence, the valve controls whether fluid flows within the tube. In addition to flow control, this invention also discloses methods and devices for connecting the air ducts with the flow channels. Various methods of closing the air ducts after they have been opened are also discussed. The use of the term "air" in this document is simply descriptive, and is meant to include any gas or gaseous phase regardless of composition.

BRIEF DESCRIPTION OF THE DRAWINGS

A more particular description of the invention briefly described above will be rendered by reference to the appended drawings. Understanding that these drawings only provide information concerning typical embodiments of the invention and are not therefore to be considered limiting of its scope, the invention will be described and explained with additional specificity and detail through the use of the accompanying drawings, in which:

FIGS. 7A–7C are plan views of a microfluidic circuit where the backpressure is monitored, and FIGS. 7D–7F are graphs of fluid pressure vs. time for the microfluidic circuits shown in FIGS. 7A–7C, respectively;

FIGS. 8A–8C are plan views of a microfluidic circuit where a pressure sensor is located in an air duct, and FIGS. 8D–8F are graphs of gas pressure vs. time for the microfluidic circuits shown in FIGS. 8A–8C, respectively;

DETAILED DESCRIPTION OF THE PREFERRED EMBODIMENTS

A preferred embodiment of the invention is now described with reference to the FIGS. 1–11, where like reference numbers indicate identical or functionally similar elements. The components of the present invention, as generally described and illustrated in the Figures, may be implemented in a wide variety of configurations. Thus, the following more detailed description of the embodiments of the system and method of the present invention, as represented in the Figures, is not intended to limit the scope of the invention, as claimed, but is merely representative of presently preferred embodiments of the invention.

Fluid cannot enter a closed capillary unless it is forced in under high pressure, or unless there is a means for the air within the capillary to escape. The air may escape if there is a downstream opening that allows air to be displaced out of the system, or if the inlet to the capillary is sufficiently large that it acts as both the fluid inlet and air outlet. The use of the term "air" in this document is simply descriptive, and is meant to include any gas or gaseous phase regardless of composition.

Flow Barriers

Certain passive fluid control methods function well when capillary forces, or negative capillary forces, are present in sufficient strength to generate pressure barriers useful for the control of fluid within a microfluidic circuit. However, if capillary forces cannot be relied upon, as in the case when a complicated fluid sample is being processed, then alternative methods of fluid control are needed. A complicated fluid sample is one that is or contains elements that substantially reduce the surface tension of the fluid within the system, or a fluid that has a contact angle at or near 90° with the material comprising the fluid channel.

An alternative to capillary stop junctions and the like are pneumatic pressure barriers. Pneumatic pressure barriers are the closed columns of air that generate a pressure sufficient to stop the flow of advancing fluid within a microfluidic circuit. The pressure required of the closed air column can be generated by the compression of the air by the advancing fluid, or by an insertion of air through an air duct by an external pump. The advancement of the fluid within the fluid circuit is not caused by capillary forces, as they may not be present in sufficient strength, but by pressure driven flow, such as the utilization of an external syringe pump, or an integrated micropump. The lack of positive capillary forces can be ensured, if needed, by the addition of surfactants or solvents to the fluid before it enters the system, or by the use of hydrophobic flow channels that create negative capillary forces with aqueous samples. Hydrophilic flow channels, when used with non-polar solutions, provide the same type of effect.

Figures 1A, 1B, 1C:
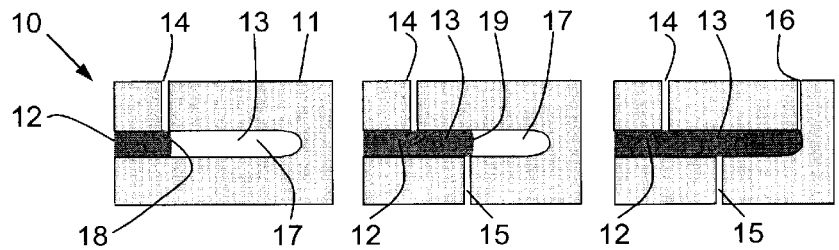
FIGS. 1A–1C are plan views of a simple microfluidic channel of the present invention.

FIGS. 1A–1C show a simple example of this principle applied in a microfluidic circuit 10 formed in substrate 11. FIGS. 1A–1C include three images that illustrate how the fluid 12 in the fluid channel 13 is controlled by air ducts 14, 15, and 16. Fluid channel 13 and the air ducts 14, 15, and 16 are formed in the substrate 11. In this simplified diagram, air ducts are shown only when in their open state, since a closed air duct is substantially functionally equivalent to an absent air duct. As shown in FIG. 1A, the fluid 12 advances to upstream air duct 14 and is stopped by the column of air 17 that is created in the closed end of fluid channel 13 when air escape is prevented by the fluid blocking upstream air duct 14. It will be appreciated that fluid 12 does not produce any significant compression of air in flow channel 13 until it has passed and blocked upstream air duct 14. Until the advancing fluid blocks upstream air duct 14, air escapes from flow channel 13 via air duct 14. Fluid 13 is stopped by a pneumatic pressure barrier 18 as it covers the open air duct 14. Thus, the pneumatic pressure barrier 18 is proximate to duct 14. As shown in FIG. 1B, when a first downstream air duct 15 is opened, fluid advances until it has reached and blocked first downstream air duct 15, at which point it is again stopped by a pneumatic pressure barrier 19 formed by the column of air 17 in the downstream end of fluid channel 13. Similarly, as shown in FIG. 1C, when second downstream air duct 16 is opened, fluid 12 advances further within fluid channel 13.

The pneumatic pressure required to stop fluid flow depends on the pressure head of the advancing fluid 12. It will also depend on whether flow must be stopped entirely, or simply diverted to another channel.

Equation (1) describes the pressure that can be generated by a compressed air column 17.

$$\Delta P = P_o\left(\frac{V_o}{V_c} - 1\right) \quad (1)$$

Where:
$\Delta P$ is the pressure produced (and equals $P_c - P_o$)
$P_c$ is the compressed air pressure
$P_o$ is the original air pressure (usually atmospheric)
$V_o$ is the original air volume
$V_c$ is the compressed air volume Equation (2) relates the change in air volume, $\Delta V$ (=$V_o - V_c$), to a volume percent change, $V\%$, proportional to $\Delta P$ $$V\% = \frac{\Delta V}{V_c} = \frac{\Delta P}{P_o} \quad (2)$$

From equation (2) it can be seen that a 1.7% change in volume will generate a $\Delta P$ of 0.25 psi, when $P_o$ is at atmospheric pressure (14.7 psi). A pneumatic pressure barrier of 0.25 psi may not appear to be substantial, but under low flow conditions it is sufficient to divert flow into an adjoining channel, or stop flow entirely if the pumping pressure is less than the pneumatic pressure barrier. To generate a pneumatic pressure barrier of 2 psi, a 13.6% volume change would be needed, under normal atmospheric conditions.

Figures 2A, 2B, 2C:
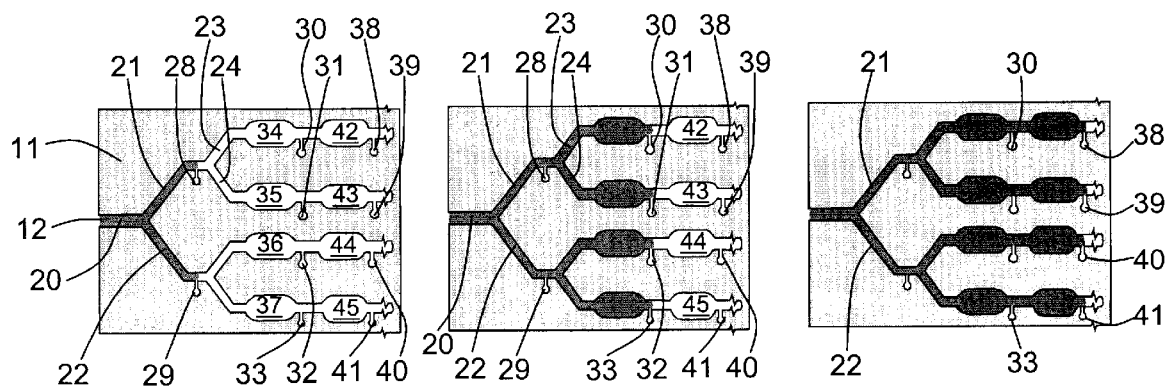
FIGS. 2A–2C are plan views of a multiplexed microfluidic circuit of the present invention.

FIGS. 2A–2C show a portion of a microfluidic circuit including single upstream or inlet channel 20 branching into two first generation daughter channels 21 and 22, each of which branches again to form two second generation daughter channels, 23, 24, 25 and 26. Without the use of mechanical valves or capillary forces, it would traditionally have been difficult to ensure that the fluid entering inlet channel 20 will divide equally among the daughter channels. Pneumatic pressure barriers provide an alternative method that can be used to perform this task.

Figures 3A, 3B, 3C:
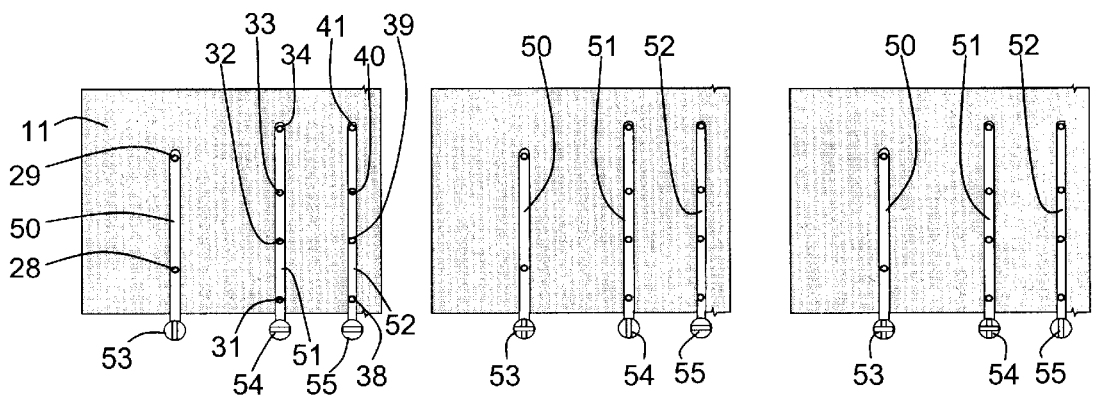
FIGS. 3A–3C are plan views of the backside of FIGS. 2A–2C, respectively.

FIGS. 2A–2C show three sets of smaller side channels that act as air ducts that allow air to escape. Air ducts 28 and 29 are placed near the points where first generation daughter channels 21 and 22 branch into second generation daughter channels. Air ducts 30, 31, 32, and 33 are located at the outlets of first wells 34, 35, 36, and 37 fed by daughter channels 23, 24, 25, and 26, respectively, and air ducts 38, 39, 40, and 41 are located at the outlets of second wells 42, 43, 44, and 45, respectively. The air ducts 28 and 29 branch off fluid channels 21 and 22 and pass through the substrate 10 to the opposite side of the substrate, as shown in FIGS. 3A–3C, where they open into first common air duct 50. Similarly, air ducts 30, 31, 32, and 33 pass through substrate 11 to second common air duct 51, and air ducts 38, 39, 40 and 41 pass through substrate 11 to connect to third common air duct 52. Each of common air ducts 50, 51, and 52 leads to an external valve 53, 54 or 56, respectively. In order to divide the fluid equally between the first generation daughter channels 21 and 22, valve 53 on first common air duct 50 is open, while valve 54 on second common air duct 52 and valve 56 on third common air duct 53 are closed, as shown in FIG. 3A. As the fluid 12 is pumped into the inlet channel 20, it will proceed to the first branching point, where it may divide equally, or it may flow primarily into one or the other of first generation daughter channels 21 and 22. If, for example, fluid 12 primarily flows through daughter channel 21, it will proceed to the air duct 28, where it will encounter a pneumatic pressure barrier 60. Pneumatic pressure barrier 60 is caused by the open air duct 28 being covered with the fluid 12, and all downstream air ducts being closed. Fluid 12 will then be diverted into and fill daughter channel 22.

Once the fluid 12 has been evenly divided between daughter channels 21 and 22, external air valve 54 connected to common duct 51 can be opened, shown in FIG. 3B. This can happen fairly quickly after the fluid has reached air ducts 28 and 29, so fluid pumping does not necessarily need to be paused. If pumping does need to be paused, the position of the fluid 12 at air ducts 28 and 29 can be sensed by a variety of methods disclosed herein. Pumping continues after external air valve 54 is opened, thereby opening air ducts 30, 31, 32 and 33, and fluid 12 proceeds down second generation daughter channels 23, 24, 25 and 26 and into first wells 34, 35, 36, and 37. Although fluid will generally flow first into one daughter channel and its associated well, it will stop when it reaches the stopping point at the outlets of the well, and fluid flow will be diverted to another daughter channel and its associated well. Thus first wells 34, 35, 36, and 37 will all fill before fluid 12 will pass from any of these first wells into any of the second wells. The external valves connected to common air ducts that have already been passed by the fluid 12 can remain open or be closed depending on the needs of the system.

A problem which may occur after a fluid has advanced into a particular channel or well until it is stopped by a pneumatic barrier at a stopping point, is that as the pumping continues (and the fluid pressure is consequently increased) the fluid will flow into the air duct rather than be diverted into another fluid channel or well. Several methods can be employed to ensure the fluid flows down another fluid channel, rather than down the air duct. This will be discussed in connection with the exemplary fluid circuit shown in FIGS. 2A–2C. Because air ducts 28 and 29 are connected within substrate 10 via common duct 50, external air valve 53 on common duct 50 cannot be closed after fluid has filled daughter channel 21, because it will stop flow into daughter channel 22 as well. Therefore, there is some chance that fluid 12 will flow into air duct 28 from daughter channel 21, rather than into daughter channel 22.

However, if the air ducts 28 and 29 are made hydrophobic and very small, the pressure required to force fluid 12 into air duct 28 will be greater than the pressure required to push fluid 12 into daughter channel 22. Once fluid 12 in daughter channel 22 reaches its air duct 29, external air valve 53 connected to air ducts 28 and 29 via common duct 50 can be closed if needed. A number of alternative methods for preventing fluid from flowing into air ducts will be discussed subsequently. In many cases, the long path through which the air would have to be displaced may provide enough backpressure to cause the fluid in an adjoining channel to catch up to its open air duct position.

Figure 4:
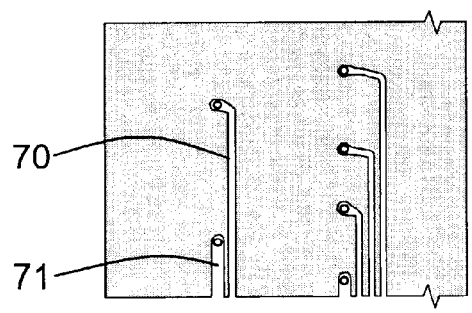
FIG. 4 is a plan view of an alternative embodiment of FIGS. 3A–3C.

Another solution to the problem discussed above it to configure air ducts at each level so that they do not communicate with one another at all, as shown in FIG. 4. FIG. 4 shows that, for example, individual ducts 70 and 71 can replace common duct 50 and air ducts 28 and 29 as shown in FIGS. 3A–3C. An external valve would be needed to control each air duct individually, rather than a single valve controlling a set of combined ducts. This allows more control of the advancing fluid, although at the expense of increased interface complexity. In this case, when reached an individual duct, the valve for that duct could be shut immediately, without waiting for the fluid in a neighboring channel to catch up to the same position in its channel. With control over individual ducts, the fluid could be divided evenly in branching channels, or be brought all the way to the end of one of the four channels before being allowed to advance in any of the remaining channels.

Preventing Fluid Flow in Air Channels

If capillary forces are present within the air ducts, then it is possible to prevent fluid from entering the air duct by the use of a capillary stop junction, a capillary stop valve, or other methods known in the art. If capillary forces are not present, then other means are needed to prevent fluid from flowing into the air ducts, or at least from flowing too far into the air ducts.

Figure 5:
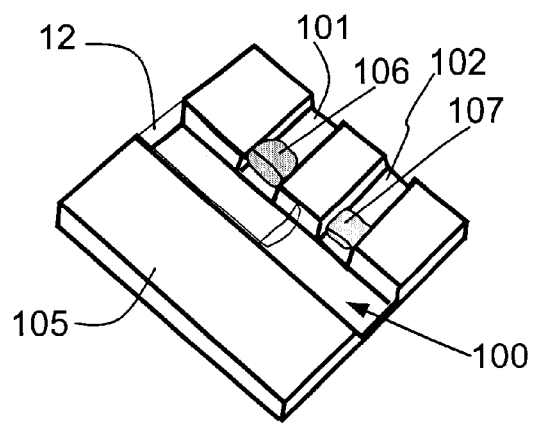
FIG. 5 is a perspective view of a fluid channel and one embodiment of the air ducts of the present invention in which a hydrogel drop closes an air duct once fluid has entered the air duct.

One option is the use of swellable materials or membranes that close the duct when fluid touches them. An example of a swellable membrane is a dried hydrogel drop. A hydrogel is an aqueous polymer suspension that can be deposited in an air duct of a microfluidic circuit by pipette, or some other means, and allowed to dry. The use of a swellable material in an air duct of a microfluidic circuit is illustrated in FIG. 5. In this example, fluid channel 100 and air ducts 101 and 102 are formed in substrate 105. A first swellable material 106 is positioned in air duct 101, and a second swellable material 107 is positioned in air duct 102. Swellable material 106 and swellable material 107 may be the same or different materials. Fluid 12 advances into fluid channel 100 until it contacts first swellable material 106. When in contact with the fluid 12, first swellable material 106 swells to a volume dependent on its composition and the character of the fluid touching it. The swelling may partially or completely close air duct 101 to prevent further advancement of fluid 12. In FIG. 5, swellable material 106 is shown in a swollen state, after being contacted by fluid 12, while swellable material 107 is shown in a non-swollen state, prior to being contacted by fluid 12.

Figure 6:
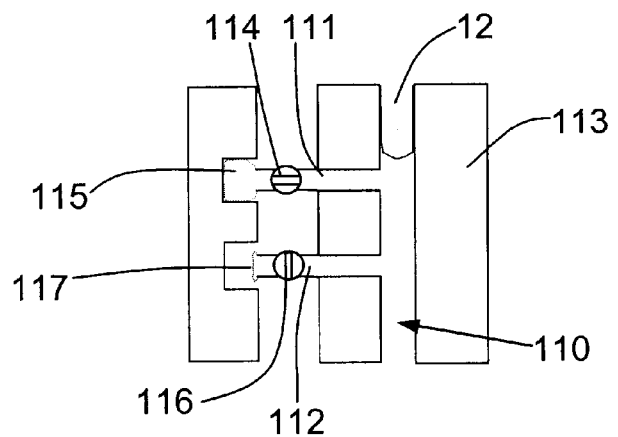
FIG. 6 is a plan view of an alternative embodiment of the air ducts of the present invention in which an expandable air bladder collects air displaced out of the microfluidic circuit.

FIG. 6 depicts another method for preventing the flow of fluid into air vents. A microfluidic circuit made up of a fluid channel 110, air duct 111 and air duct 112 formed in substrate 113 is shown. Air duct 111 includes a valve 114 and has an expandable air bladder 115 attached to its outlet. Similarly, air duct 112 includes a valve 116 and an expandable air bladder 117 at its outlet. Expandable air bladders 115 and 117 have fixed or known volumes (in this case defined by rigid enclosure 118), and are used to collect the air as it is displaced out of the circuit via air ducts 111 and 112, respectively. Once the maximum volume is reached, which equals the appropriate air volume to be displaced by the advancing fluid 12, the bladder expands no further and prevents further movement of fluid 12 within the system.

Both the swellable valve and expandable bladder methods for preventing fluid flow into air ducts have the advantage that they allow the air duct valve to be opened to permit forward movement of fluid in the circuit, but do not require that the valve subsequently to be closed to prevent flow of fluid into the air duct.

Another method of preventing flow of fluid into air ducts (not illustrated in a figure) is, assuming the volume of air that is to be displaced by the advancing fluid is known, using an air flow meter to measure the volume of air displaced out of the duct and closing the valve controlling the air duct in question when the correct volume of air has been displaced. This and the expandable bladder method both utilize pneumatic barriers to the flow of fluid into air ducts.

Referring to FIGS. 7A–7C, it may also be useful to have an external sensor 120 measure the backpressure of the fluid 12 as it flows through the fluid channel 121. Advancement of the fluid can be monitored by the fluid backpressure that is generated, which may stay fairly level, or rise slightly or steeply depending on the diameter and number of downstream channels. As the fluid encounters air ducts, channel junctions, wells, and other structures in the microfluidic circuit, a change will be detected in the measured backpressure.

If valve 125 on upstream air duct 122 is open, and valves 126 and 127 on downstream air ducts 123 and 124, respectively, are closed, then the air that is displaced by the advancing fluid will exit through the upstream air duct 122, as shown in FIG. 7A. The fluid pressure, Pf, will increase gradually, as depicted in FIG. 7D, as the fluid advances to upstream air duct 122. As shown in FIG. 7B, once fluid 12 reaches air duct 122 the only path it can possibly take is through the air duct 122 itself, because of the pneumatic pressure barrier 128 caused by the distal valves 126 and 127 being closed. However, if the air duct 122 is substantially smaller than the fluid channel 121, it will require significantly more pressure to force the fluid 12 into air duct 122 than to pump the fluid 12 through the regular fluid channels 121, provided there are no positive capillary forces present. The increase in back pressure (as shown in FIG. 7E) will be detected by sensor 120, which can provide a signal to cause actuators to close air duct 122 to attain the state shown in FIG. 7C. If pressure is applied to the fluid while valves 125, 126, and 127 are closed, as in FIG. 7C, the measured backpressure will continue to increase, at a greater slope, as shown in FIG. 7F.

Equation (3) shows the relationship between pressure drop and channel radius (for circular cross-sectional channels).

$$\Delta P = \frac{8QL\mu}{\pi r^4} \quad (3)$$

Where:

$\Delta P$ is the pressure drop over a given distance L;

Q is the flow rate of the fluid;

$\mu$ is the viscosity of the fluid; and r is the radius of the flow channel.

As can be seen from equation (3), the pressure over a particular distance is inversely proportional to the radius of the channel to the fourth power. If the radius of the fluid channel is only twice the radius of the air duct, then the pressure drop over a given distance is sixteen times greater for fluid flowing in the air duct than if it were flowing in the fluid channel. If the air duct is ten times smaller, the pressure drop is 10,000 times greater. Thus, referring back to FIGS. 7A–7F, monitoring fluid backpressure may be a useful method of both sensing the position of fluid 12 in a fluid channel 121, as well as knowing when to close an air duct valve (eg., valve 125). Alternatively, fluid flow, rather than backpressure may be monitored, by using a flow meter in place of a pressure sensor 130, in which a decrease in flow, rather than an increase in pressure, would indicate the arrival of fluid at a stopping point.

Referring to FIGS. 8A–8C, it may also be useful provide a pressure sensor 130 to the fluid circuit shown in FIGS. 7A–7F, to sense air pressure of air passing from a downstream air duct 123 through to an upstream air duct 122, the air flow being indicated by the arrows in FIG. 8A. The airflow may be low so sensor 130 will detect a minimal pressure, as shown in FIG. 8D. Once fluid 12 reaches the upstream air duct 122, as shown in FIG. 8B, the exit route for the air flow is blocked, so the air pressure will increase sharply, as depicted in FIG. 8E. This increase can be detected and used as a signal to shut upstream air duct valve 125, to obtain the state shown in FIG. 8C. The increase in pressure can also be used as an indication of the position of fluid 12 in the microfluidic circuit. The airflow can be generated by a compressed air or gas source, or by a pump.

As has been mentioned, a pressure signal can be generated by flowing air slowly through a downstream air duct 123 so that it escapes through the upstream air duct 122. The pressure signal is sensed in the air delivery system and shows an increase when the upstream air duct 122 is covered by the advancing fluid 12.

This same system provides the ability to increase the magnitude of the pneumatic pressure barrier 128 by delivering an air volume to the fluid channel 121 similar to the air volume that is compressed by the advancing fluid 12. In this manner a greater pneumatic barrier 128 may be generated without the need for the advancing fluid to proceed further down the channel 12 to compress the air. From equations (1) and (2) the term "Po" is effectively increased, so $\Delta P$ can be higher with a smaller $\Delta V$.

The air flow from a downstream air duct 123 to the upstream air duct 122 is kept low so the pneumnatic back pressure the advancing fluid 12 is pushing against is minimal. The pressure only increases significantly when the upstream air duct 122 is covered by advancing fluid 12. Upstream air duct valve 125 should be closed as quickly as possible (depending on its configuration with the other air ducts in the same set) so the increase in air pressure does not force fluid too far into the air duct 14. At this time the pneumatic pressure barrier 16 will increase to the value of the static air pumping pressure, which can be regulated. Hence the pneumatic pressure barrier 128 can be controlled independently of the movement of fluid 12 needed to compress the gas in the system.

If all air ducts in a system are connected via a channel on the backside of the substrate 10, as shown in FIGS. 3A–3C, or by some other means, then the pneumatic pressure barrier will not increase to the static air pumping pressure once one air duct (e.g., air duct 28 or 29) is covered. Instead, the flow rate of air escaping the upstream ducts will be reduced, but not stopped. It will only be stopped when all proximal air ducts (in this example, both 28 and 29) are covered. However, this reduction in flow will also translate into an increase in ambient pressure within the system, provided the decrease in area through which the air escapes is substantial enough to generate a backpressure. This increase in system pressure can be sensed and provide information on the position and advancement of the fluid, but it can also provide somewhat of a pneumatic barrier for the fluid that is already at its air duct, so that it does not proceed further down the system, a potential problem when the air ducts are interconnected. The pneumatic barrier can act somewhat as an increased pressure to push the fluid in the adjoining channels to catch up to their air ducts.

Referring back to FIGS. 8A–8F, a similar system could use an air flow meter 130 to monitor the flow rate of the air entering the distal channel, or exiting the proximal channel. Once fluid 12 covers the opening to the upstream air duct 122 the air flow will drop sharply. This can be used as a positioning sensor as well as a signal to close the appropriate valves 125, 126, etc.

Figure 9:
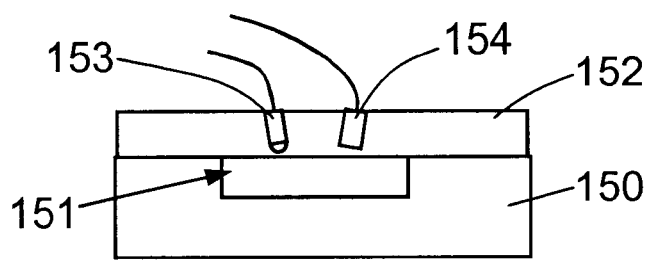
FIG. 9 is a plan view of an embodiment of the sensor of the present invention.

Various types of sensors in a preferably permanent (i.e., non-disposable) portion of the microfluidic system may be used to detect the position of fluid within the circuit. One possible sensor is shown in FIG. 9. A microfluidic circuit including a fluid channel, indicated generally by reference number 151, is formed in a substrate 150. Substrate 150 may be a simple and inexpensively manufactured, and thus disposable or non-permanent portion of the microfluidic device. Top plate 152 encloses and forms the upper surface of the microfluidic circuit. At least one optical light source 153 and at least one optical detector 154 may be located in top plate 152, as depicted in FIG. 9, or light source(s) and optical detector(s) can be located at a remote locations, and optical signals sent to and from the top plate via fiber optics. Any space between fluid in fluid channel 151 would need to be mostly transparent to whatever wavelength of light that is used. Various mechanisms for optical detection of fluid may be envisioned. For example, the system may be configured so that sensed light level will drop when the fluid is present. This would be the case when an index of refraction mismatch in the absence of fluid causes most light to be reflected off the bottom surface of the top plate, and back into the detector 154; conversely, when in the presence of fluid, more light would be transmitted through the bottom surface of the top plate and into the fluid, where it would subsequently be scattered, thus causing cause a reduction in the reflected signal. In another detection method, in which the fluid to be sensed is fluorescent, light source 153 would produce an excitation signal at a first wavelength, and the fluid, when present, would produce a fluorescence signal at a different wavelength, which would be sensed by detector 154. Moreover, in place of separate light source 153 and detector 154, a single fiber containing both forward and reflected signals could be used, with the two signals being split off and sensed at a convenient place within the system.

Other types of sensors that can be used to detect the presence of the fluid include magnetic, capacitive, NMR, chemical, and acoustic sensors. As in the case of the optical detection system, it would be preferable that the sensing system would be permanently fixed in the durable portion 152 of the microfluidic assembly, so the microfluidic substrate can be as simple and inexpensive as possible. The sensing electronics would be tuned to detect a threshold signal, indicating the presence or absence of fluid at that particular point in the fluid circuit. This signal could then be used to close an air duct valve 18 or turn off the pump.

Stopping or Diverting Flow

As has been mentioned previously, fluid is preferably pushed through the microfluidic circuit by the use of a pressure driven pumping mechanism, such as a syringe pump or micropump. This provides the advantage that the pumping pressure and pumping rate can be controlled, which may not be possible, or may be possible only in a very limited fashion, in capillary or gravitational driven systems.

A further advantage of pump control is that pneumatic pressure barriers may be used to either divert or stop fluid flow. In the case of stopping flow, the pump may have a pumping pressure greater than can be overcome by a pneumatic pressure barrier, without a considerable compression of system air volume as described by equations (1) and (2). This potentially high pressure may also have a negative impact on the physical integrity of the whole system. However, such pressures do not need to be reached in order to stop the fluid flow. It is only necessary to determine when the fluid has reached the desired stopping point, for example by any of the sensing methods described in the previous section, and then the pump can be turned off until it is desired for the fluid to advance further into the circuit.

The main requirement for fluid flow to be diverted is for a pneumatic pressure barrier to provide enough of a barrier so as to stop the forward momentum of a fluid and cause it to redirect itself along a path that provides little or no barrier to flow. Because a pneumatic pressure barrier increases as the compressed gas becomes further compressed, the goal in this instance is to provide a substantial enough barrier to redirect flow within an acceptable range of fluid movement causing the compression.

In microfluidics it is often the case that the flow regime is very laminar. In fact, the Reynolds number characterizing flow in microfluidics is often 0.1 to 0.001 or less. Reynolds numbers less than 1 are usually considered laminar. The Reynolds number is the ratio of inertial forces over viscous forces and is shown in equation (4):

$$Re = \frac{V \cdot d}{\upsilon} \quad (4)$$

Where:

V is the velocity of the moving fluid;

d is the diameter of the flow channel; and $\upsilon$ is the kinematic viscosity of the fluid.

With Reynolds numbers much less than one, the moving fluid 11 has virtually no momentum. Without being bound by theory, it is currently believed that pressure barriers less than 0.1 psi are often effective at redirecting the flow of fluid 11 from its main channel 12 to a side channel 12 at flow rates of 5 µL/min or less, in flow channels 12 greater than 100 µm in diameter. From equations (1) and (2), a pressure barrier of 0.1 psi equates to a gas volume compression of approximately 0.7%. If the flow channel 12 at the point of the barrier 16 is 300 µm in diameter, and the total downstream air volume in the fluid circuit is 15 µL, a 0.7% compression in air volume represents a movement of fluid 11 approximately 1.5 mm down the fluid channel 12, which is reasonable for most applications.

Interfacing to a Substrate

One purpose of the pneumatic pressure barriers generated in the applications described above is to provide control of fluid flow in a microfluidic circuit when capillary forces alone cannot be relied upon to provide sufficient flow control. As mentioned previously, integrated mechanical valves can also be used, but they may substantially increase the cost of the microfluidic system. Similarly, electric or magnetic field based systems have certain drawbacks.

Pneumatic pressure barriers generated through the use of external valves and pumps make it possible to control the flow of fluid in a microfluidic substrate while keeping the microfluidic device itself as simple and inexpensive as possible. However, care must be taken in the design of such systems so that the interfacing of external fluidic and pneumatic devices does not become overly complicated.

Figure 10:
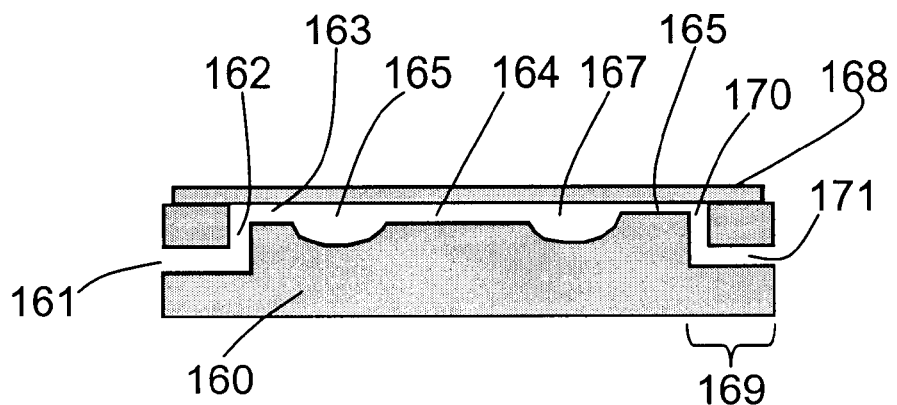
FIG. 10 is a cross-sectional view of a microfluidic circuit.

FIG. 10 illustrates the construction of a microfluidic device according to the present invention. The microfluidic circuitry is formed in a substrate 160. Inlet channel 160 may be drilled into the side of substrate 161, and secondary inlet channel 162 formed by cross drilling channel to connect inlet channel 160 to surface channel 163. Surface channels 163, 164, and 165 may be formed in the top surface of substrate 160, by, for example, laser ablation. Many methods of creating surface channels may be used, depending on the substrate and the desired flow system tolerances. Other methods besides laser ablation include deep reactive ion etching, wet chemical etching, ion beam etching, hot embossing, machining, and injection molding. Inlet channel 161 and secondary inlet channel 162 can also be formed using many of these methods. FIG. 10 also shows two wells 166 and 167 in which a fluid moving through the microfluidic circuit can reside and undergo various chemical reactions or processes. The end of surface channel 169 connects to an air duct 169 formed by cross channel 170 and side channel 171. The microfluidic circuit formed in substrate 160 is covered and enclosed by top plate 168.

Figure 11:
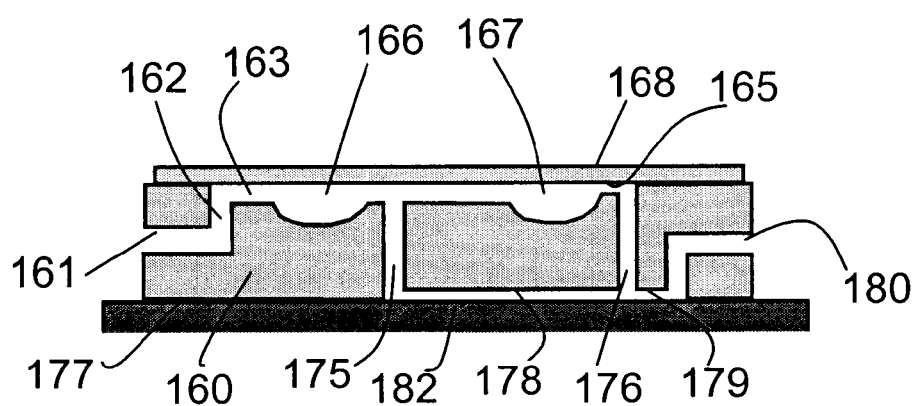
FIG. 11 is an alternative embodiment of FIG. 10.

Air duct 169 can be formed using the same techniques as the fluid channels 161, 162, 163, 165, or 167, as they are generally of the same dimensions (roughly 1 to 1000 µm). In some embodiments air duct(s) 169 may be placed in other locations on the top surface of the substrate 10. In other embodiments, as illustrated in FIG. 11, due to the complexity of the fluidics or air handling, it may be desirable for the air ducts, indicated here by 175 and 176, to passed through substrate 160 to bottom face 177 of the substrate 160, additional connecting air ducts 178 and 179 may be needed to connect the air ducts to an outlet 180 at the side of the substrate. By placing air ducts at the opposite side of substrate 160, more fluid channels and air ducts can be formed in substrate 160. When channels and air ducts are formed in either side of substrate 160, a bottom plate 182 must be used to close ducts or channels in bottom face 177, similar to top plate 168 on the opposite side of substrate 160.

With continued reference to FIGS. 10 and 11, the surface structures (channels or wells) 163, 167 may be permanently or temporarily "sealed" by a variety of methods. These include ultrasonic welding or gluing a top plate 168 to cover the surface structures, or placing a pliable film on top of the substrate 160 and pressurizing it so that it is sealed to substrate 160 to enclose the surface structures. Whatever method is employed, it is important that the surface structures remain patent to the fluid or air that is to pass through them.

If air ducts are brought to the backside of the substrate 160, as in FIG. 11, they may be "sealed" by the same manner as described for channels and wells in the top surface of substrate 160. In place of a top plate 168 or bottom plate 182, any appropriately shaped surface could be used to seal surface structure in substrate 160. For example, a surface of a further component of a microfluidic device, a structure in which substrate 160 was mounted, or various other structures may serve to close and cover microfluidic surface structures.

For either the fluid or air connection, a simple friction fit of tubing into the side holes 161, 171, or 180 maybe sufficient. Tubing may also be glued in place, or the substrate 160 may be molded such that a nipple of some sort may be formed on the side that allows for tubing to be easily connected. If the substrate is thick, standard tubing may be used (such as 1/16 inch Teflon™ tubing). If the substrate is thin, the tubing may need to be necked down, or a smaller diameter (such as 0.030 inch PEEK) tubing may be needed. In a currently preferred embodiment, a friction fit of 0.030 inch PEEK tubing into the side of a Teflon substrate maintained an airtight connection to the substrate up to pressures of 25 psi gauge.

One purpose of fluid control is to cause the fluid 12 to move appropriately through the fluid channels, but ultimately the fluid 12 will probably require some form of processing, such as a chemical reaction, to generate a new chemical species, precipitate out a species, amplify a species, or for some other purpose. These reactions often take place in reaction wells such as wells 166 and 167 in FIG. 10, or wells 34–37 or 42–45 in FIGS. 2A–2C. If a system is highly multiplexed, as in FIGS. 2A–2C, it is usually desirable for the reactions to take place at the same time in each multiplexed well 34–37 before the samples move further down the processing circuit. FIGS. 2A–2C show a single inlet channel 20 branching into four daughter channels 23–26, and the four daughter channels 23–26 having reaction wells 34–37 and 42–45, respectively, at two places along each channel. Air ducts 30–33 and 38–41 the outlets of each well allow for a pneumatic pressure barrier to stop fluid flow and contain fluid 12 within the respective well. Fluid can proceed along the main channel and branch evenly as described earlier. However, the pump does not actually need to stop pumping. It can maintain a slow, steady pumping rate and the fluid 12 will divide in the channels 23–26 automatically. However, when the fluid 12 needs to be stopped altogether, the mechanism is slightly different.

To stop the fluid 12 in the wells 34–37, for example, the valves 54 controlling the flow of air through the ducts 30–32 at the outlets of the wells 34–37 need to be closed once all wells are filled. All downstream valves are preferably closed. Then the pneumatic pressure barrier must either be great enough to oppose forward pumping motion, or, preferably, the pumping will be switched off, either because a known volume has been delivered, or because a signal is generated that turns the pump off. The signal is generated due to the system sensing, by any of the methods described earlier, that the fluid 12 has filled all of the appropriate wells 34–37, as shown in FIG. 2B. The use of the term "well" in this application means any reaction zone, not necessarily an enlargement of a channel.

Once the desired reaction is complete the next sequence of downstream air ducts 38–41 are opened, removing the pressure barrier 16, and the pumping is resumed, permitting fluid to flow into wells 42–45.

What is claimed is:

1. A method of controlling fluid flow within a microfluidic circuit comprising:
   (a) providing a micro fluidic circuit comprising an inlet through which fluid is introduced into the circuit, at least one microchannel for fluid flow in fluid communication with said inlet, at least one upstream air duct in communication with said at least one microchannel at an upstream connection point, and at least one downstream air duct in communication with said at least one microchannel at a downstream connection point, wherein said at least one microchannel is initially filled with air that is displaced by advancing fluid, and wherein said at least one upstream air duct and said at least one downstream air duct are configured to prevent fluid from entering the air ducts;
   (b) introducing a fluid into the inlet; and
   (c) controlling the opening and closing of the air ducts, thereby releasing and generating a pneumatic pressure barrier proximate to and downstream of at least one said connection point to control the flow of fluid in said at least one microchannel.

2. The method of claim 1, wherein said fluid is introduced into said microfluidic circuit under pressure.

3. The method of claim 1, wherein the air ducts are opened and closed by external valves.

4. The method of claim 1, further comprising the steps of:
   (a) opening the at least one upstream air duct and a downstream air duct; and
   (b) injecting a gas into the open downstream air duct such that when fluid advancing in said at least one microchannel is upstream of the open upstream air duct, the injected gas escapes through the open upstream air duct, and when fluid advancing in said at least one microchannel covers the upstream air duct, the injected gas strengthens said pneumatic barrier.

5. The method of claim 1, further comprising the steps of:
   (a) sensing the position of the fluid within the microfluidic circuit; and
   (b) opening or closing the air ducts based upon the position of said fluid to generate and release pneumatic barriers thereby stopping and starting fluid flow at desired stopping points within the circuit.

6. The method of claim 1, wherein the microfluidic circuit further comprises a pressure sensor located in the downstream air duct that detects the position of the fluid in the circuit, and wherein the method further comprises the steps of:
   (a) detecting a back pressure of the air being injected into the open downstream air duct with the pressure sensor; and
   (b) correlating the back pressure of the air with the fluid's position at the various stopping points.

7. The method of claim 6, comprising the further step of:
   (c) opening or closing the air ducts based on the position of the fluid within the circuit to generate and release pneumatic barriers thereby stopping and starting fluid flow at desired stopping points within the circuit.

8. The method of claim 1, wherein at least one said air duct is in communication with a fixed volume bladder configured to expand to contain air displaced by advancing fluid, and wherein after said bladder has expanded to said fixed volume essentially no further air flow occurs in said air duct, causing a pneumatic pressure barrier to be generated within said microchannel.

9. The method of claim 1, further comprising the steps of:
   (a) opening the at least one upstream air duct to allow the fluid to advance in said at least one microchannel until the fluid reaches and covers the at least one upstream air duct, which strengthens the pneumatic barrier and prevents fluid flow beyond the at least one upstream stopping point; and
   (b) opening at least one downstream air duct, to allow the fluid to advance within said at least one microchannel to the stopping point proximate to and downstream of said downstream air duct.

10. The method of claim 1, wherein the microfluidic circuit further comprises at least one sensor for detecting the position of the fluid in the circuit, and wherein the method further comprises the steps of:
    (a) detecting the position of the fluid in the circuit with the sensor; and (b) selectively opening or closing the air ducts based upon the position of the fluid in order to control fluid flow within the circuit.

11. The method of claim 10, wherein fluid flow within said microchannel is stopped by closing an air duct.

12. The method of claim 10, wherein the at least one sensor is an optical sensor for detecting the presence of fluid.

13. The method of claim 10, wherein the at least one sensor is located at the fluid inlet to detect back pressure in the fluid.

14. The method of claim 13, further comprising the steps of:
   (a) monitoring the back pressure of the fluid introduced into the microfluidic circuit;
   (b) determining the fluid's position based upon the monitored back pressure; and
   (c) opening or closing the air ducts based on the fluid's position within the circuit to generate and release pneumatic barriers thereby controlling fluid flow within the circuit.

15. The method of claim 10, wherein fluid flow within said microchannel is started by opening an air duct.

16. The method of claim 10, wherein said fluid circuit comprises a branch microchannel connecting to said at least one microchannel upstream of at least one said air duct, and wherein fluid flow is diverted from said at least one microchannel into said branch microchannel by closing at least one said air duct to generate a pneumatic pressure barrier in said at least one microchannel.

17. A method of controlling fluid flow in a microfluidic circuit, comprising the steps of:
   (a) providing a microfluidic circuit comprising an inlet, at least one microchannel, and at least one air duct communicating with said at least one microchannel, wherein said microfluidic circuit is initially filled with air;
   (b) introducing fluid into said microfluidic circuit under pressure via said inlet;
   (c) causing fluid to advance in said microchannel upstream of one said air duct while permitting air downstream of the advancing fluid to flow out of said microchannel via said air duct; and
   (d) subsequently preventing the flow of air out of said microchannel via said air duct, thereby generating a pneumatic pressure barrier in said microchannel opposing advancement of fluid in said microchannel.

18. The method of claim 17, wherein air flow out of said microchannel via said air duct is prevented by blocking the flow of air through said air duct.

19. The method of claim 17, wherein air flow out of said microchannel via said air duct is prevented by introducing pressurized air into said air duct.

20. The method of claim 18, wherein said microfluidic circuit comprises a second microchannel branching from said at least one microchannel upstream of said air duct, wherein said pneumatic pressure barrier causes fluid flow to be diverted from said at least one microchannel into said second microchannel.

21. The method of claim 17, comprising the further step of:
   (a) Permitting the flow of air out of said microchannel via at least one air duct, thereby releasing said pneumatic pressure barrier in said microchannel and permitting advancement of fluid in said microchannel.

22. The method of claim 21, wherein said step of permitting flow of air out of said microchannel is performed by opening an air duct downstream of the air duct used to generate said pneumatic pressure barrier.

23. The method of claim 17, comprising the additional step of:
   (a) Determining the location of fluid advancing in said microchannel; and
   (b) Performing the step of preventing flow of air out of said microchannel via said air duct as a function of the arrival of fluid at a selected location in said microchannel.

24. The method of claim 21, comprising the additional step of:
   (a) Determining the location of fluid advancing in said microchannel; and
   (b) Performing the step of permitting flow of air out of said microchannel via said air duct as a function of the arrival of fluid at a selected location in said microchannel.

25. A microfluidic circuit comprising:
   a substrate having at least one channel for fluid flow and having at least one air duct connecting to said at least one channel at a first connection point, herein said at least one channel is initially filled with air that is displaced by advancing fluid; and
   at least one stopping point proximate to and downstream of said First connection point where the flow of fluid advancing in said at least one channel from upstream of said first connection point can be at least temporarily slopped by a controllable pneumatic pressure barrier;
   wherein said at least one air duct is configured to permit the escape of said air displaced by said advancing fluid from an air column within said channel while said fluid is upstream of said first connection, and wherein said at least one air duct is configured to prevent the escape of air from said air column when said fluid has advanced past said first connection point.

26. The microfluidic circuit of claim 25, wherein one air duct is in communication with each of the at least one stopping points within the circuit.

27. The microfluidic circuit of claim 25, wherein at least one said air duct further comprises a swellable material adapted to swell upon contact with fluid to reduce or block fluid flow in said air duct.

28. The microfluidic circuit of claim 27, wherein said swellable material comprises a hydrogel material.

29. The microfluidic circuit of claim 25, wherein at least one said air duct further comprises a capillary barrier adapted to prevent fluid from entering the air duct.

30. The microfluidic circuit of claim 25, wherein said pneumatic pressure barrier is formed when fluid flow in said at least one channel is opposed by air trapped within said air column downstream of said fluid, and wherein said pneumatic pressure barrier may be removed by releasing the air within said air column.

31. The microfluidic circuit of claim 30, wherein said air is released through at least one downstream air duct connecting to said at least one channel at a second connection point downstream of said first connection point.

32. The microfluidic circuit of claim 31, wherein said at least one downstream air duct is configured such that said air is released through a closable external valve.

33. The microfluidic circuit of claim 32, wherein said closable external valve is open while fluid advances upstream of said second connection point and configured to close when the fluid reaches a stopping point proximate to and downstream of said second connection point to prevent the fluid entering said downstream air duct.

34. The microfluidic circuit of claim 32, wherein said closable external valve is configured to close when the fluid reaches a selected upstream stopping point to prevent fluid from advancing in said channel.

35. The microfluidic circuit of claim 32, further comprising a sensor for determining the location of the fluid within the circuit and generating a signal to close the external valve such that air is not able to escape and the fluid flow is stopped at the stopping point.

36. The microfluidic circuit of claim 35, wherein the sensor comprises an optical sensing device.

37. The microfluidic circuit of claim 35, wherein the sensor comprises a pressure sensor for measuring the backpressure on the fluid.

38. The microfluidic circuit of claim 35, wherein the sensor comprises a flow sensor.

39. The microfluidic circuit of claim 38, wherein the flow sensor is located in one of the air ducts and senses air flow.

40. The microfluidic circuit of claim 25, wherein at least one said air duct is configured to allow air to escape into a fixed volume expansion bladder that is configured to receive a fixed volume of air, wherein after said fixed volume of air has escaped into said expansion bladder the advancement of the fluid beyond an associated stopping point and the entry of fluid into said air duct is prevented.

41. The microfluidic circuit of claim 40, wherein the sensor comprises a pressure sensor located in one of the air ducts.

42. A microfluidic circuit comprising:
(a) a plurality of connected microchannels;
(b) an inlet through which fluid is introduced into the circuit, said circuit being initially filled with air that is displaced by advancing fluid; and
(c) a plurality of air ducts, each said air duct in communication with one of said microchannels at a connection point, wherein said air ducts are selectively opened or closed to control gas flow into and out of said microchannels to generate and release pneumatic barriers within said microchannels thereby controlling fluid flow within the circuit,
wherein each said pneumatic barrier is generated at a stopping point proximate to and downstream of one connection point when said microchannel contains a closed air column downstream of said stopping point, and is released by opening of at least one air duct downstream of said connection point to permit the escape of air from said microchannel through said air duct.

43. The microfluidic circuit of claim 42, wherein each said air duct is selectively opened or closed by an external valve in gaseous communication with said air duct.

44. A fluid handling system comprising:
(a) a substrate having formed therein a microfluidic circuit comprising an inlet, at least one microchannel in fluid communication with said inlet, and at least one air duct communicating with said microchannel;
(b) a fluid source connected to said inlet for introducing fluid into said microfluidic circuit, said microfluidic circuit being initially filled with air that is displaced as fluid enters said circuit; and
(c) an external valve connected to said at least one air duct for regulating the flow of gases through said at least one air duct;
wherein flow of gases out of said microchannel through said air duct weakens a pneumatic pressure barrier obstructing the flow of fluid in said at least one microchannel upstream of said air duct and flow of gases into said microchannel through said air duct strengthens a pneumatic pressure barrier obstructing the flow of fluid in said at least one microchannel upstream of said air duct.

45. The fluid handling system of claim 44, wherein said fluid source introduces fluid into said microfluidic circuit under pressure.

46. The fluid handling system of claim 44, wherein said at least one microchannel comprises a branched microchannel comprising a first daughter channel and a second daughter channel.

47. The fluid handling system of claim 46, wherein said microfluidic circuit comprises a first air duct communicating with said first daughter channel and a second air duct communicating with said second daughter channel.

48. The fluid handling device of claim 47, further comprising a well connected downstream of at least one of said first and second daughter channels.

49. A microfluidic device comprising:
(a) a substrate;
(b) a microfluidic fluid circuit formed in said substrate, the microfluidic circuit comprising:
(1) an inlet;
(2) at least one microchannel in fluid communication with said inlet, said microchannel being initially filled with air;
(3) at least one air duct communicating with said microchannel at a first connection point and adapted to control the flow of fluid advancing in said microchannel by controlling a pneumatic pressure barrier located in said microchannel downstream of the advancing fluid, wherein fluid advancing in said at least one microchannel can be at least temporarily stopped by the controllable pneumatic pressure hairier at a stopping point, and wherein said at least one air duct is configured to prevent the escape of said air displaced by said advancing fluid from an air column within said microchannel while said fluid is upstream of said first connection point, and wherein said at least one air duct is configured to prevent the escape of air from said air column when said fluid has advanced past said first connection point; and
(c) a sensor for detecting the position of a fluid within said microfluidic circuit.

50. The microfluidic device circuit of claim 49, wherein said at least one microchannel comprises a branched microchannel comprising a first daughter channel and a second daughter channel.

51. The microfluidic device of claim 50, further comprising a first air duct communicating with said first daughter channel and a second air duct communicating with said second daughter channel.

52. The microfluidic device of claim 51, further comprising a well connected downstream from at least one of said first and second daughter channels.

53. The microfluidic device of claim 49, further comprising a top plate adapted to fit against said substrate to cover and enclose at least a portion of said microfluidic circuit.

54. The microfluidic device of claim 49, further comprising a bottom plate adapted to fit against said substrate to cover and enclose at least a portion of said microfluidic circuit.

* * * * *